(12) United States Patent
Choi

(10) Patent No.: US 8,143,715 B2
(45) Date of Patent: Mar. 27, 2012

(54) SEMICONDUCTOR PACKAGE TRANSFORMER

(75) Inventor: Cheol Ho Choi, Hwaseong-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 146 days.

(21) Appl. No.: 12/461,869

(22) Filed: Aug. 26, 2009

(65) Prior Publication Data

US 2010/0052152 A1   Mar. 4, 2010

(30) Foreign Application Priority Data

Aug. 27, 2008   (KR) .................. 10-2008-0083719

(51) Int. Cl.
 *H01L 23/482*   (2006.01)
 *H01L 23/538*   (2006.01)

(52) U.S. Cl. ................ 257/697; 257/369; 257/731

(58) Field of Classification Search .............. 257/697, 257/690, 731
 See application file for complete search history.

(56) References Cited

U.S. PATENT DOCUMENTS

| | | | | |
|---|---|---|---|---|
| 4,226,281 A * | 10/1980 | Chu | ............... | 165/80.2 |
| 5,479,319 A * | 12/1995 | Werther | ............... | 361/784 |
| 5,481,436 A * | 1/1996 | Werther | ............... | 361/784 |
| 5,730,606 A * | 3/1998 | Sinclair | ............... | 439/70 |
| 6,431,899 B1 * | 8/2002 | Keller | ............... | 439/342 |
| 6,803,650 B2 * | 10/2004 | Schutt-Aine et al. | ......... | 257/697 |
| 7,732,905 B2 * | 6/2010 | Yoon | ............... | 257/686 |
| 2004/0017006 A1 * | 1/2004 | Deeney et al. | ......... | 257/727 |
| 2004/0222514 A1 * | 11/2004 | Crane et al. | ......... | 257/697 |
| 2006/0012026 A1 * | 1/2006 | Kang et al. | ......... | 257/697 |
| 2011/0033019 A1 * | 2/2011 | Rosenbaum et al. | ......... | 376/272 |

* cited by examiner

*Primary Examiner* — Jerome Jackson, Jr.
*Assistant Examiner* — David Spalla

(57) ABSTRACT

The present invention relates to a semiconductor package transformer. There is provided a semiconductor package transformer including: a case where an opening into which a semiconductor package having a chip mounted on a substrate is inserted is formed on its front surface and an open part exposing is formed on its upper surface; and a plurality of holes that are formed on the bottom surface of the case.

8 Claims, 4 Drawing Sheets

[FIG. 1]
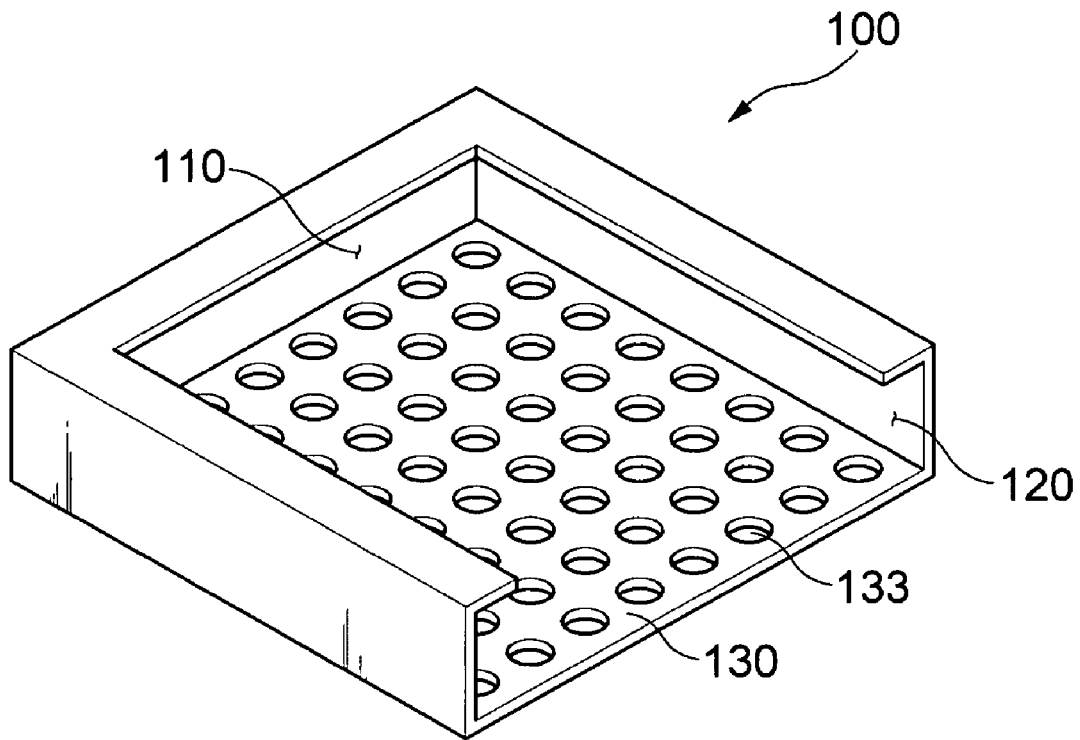
[FIG. 2]
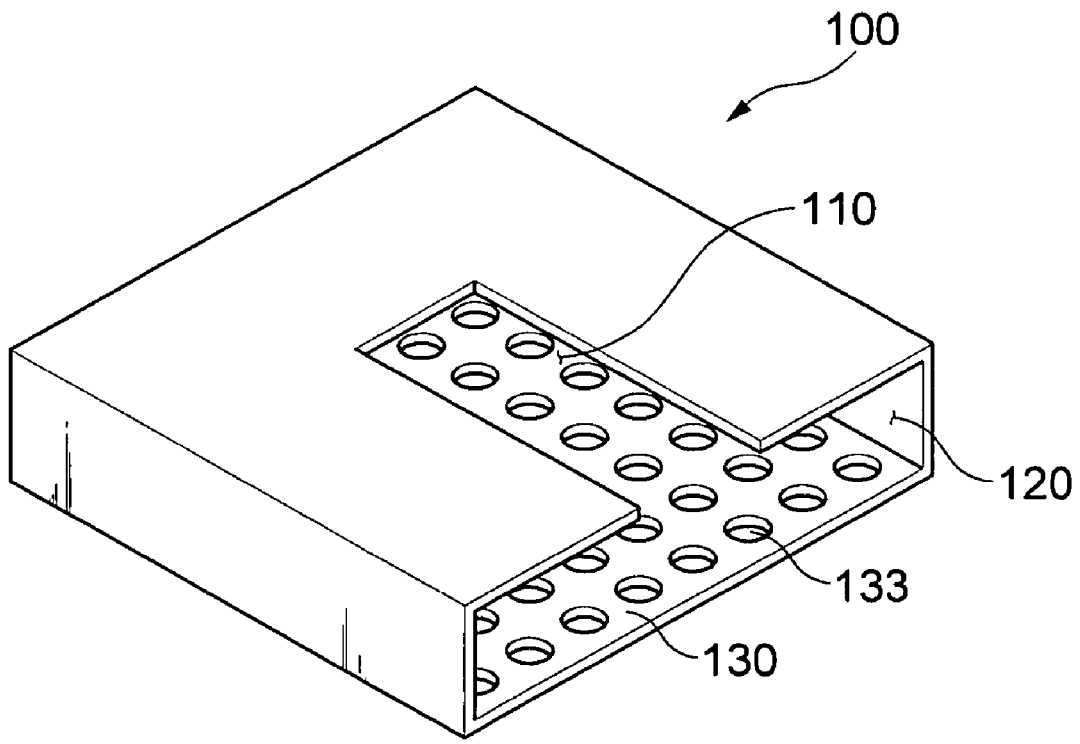

[FIG. 3]
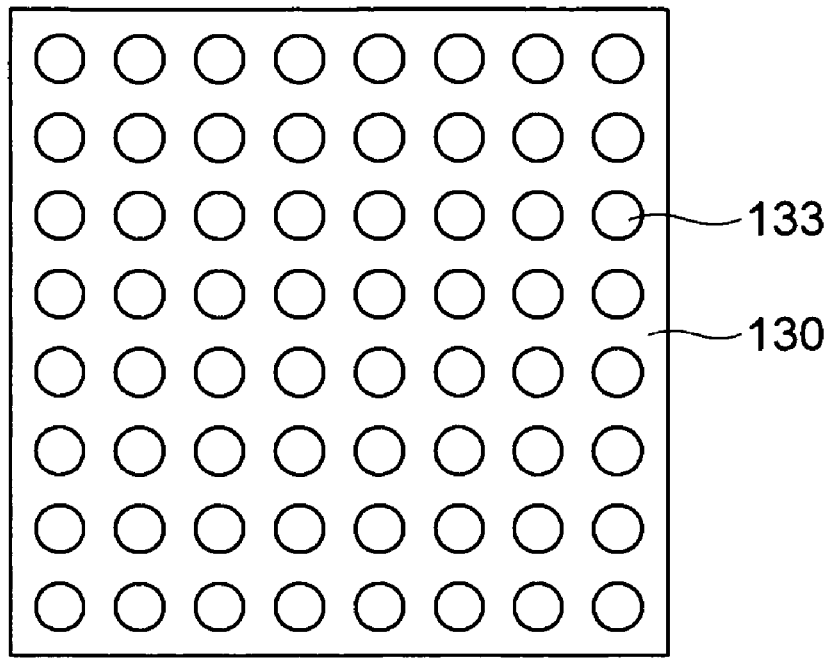
[FIG. 4]
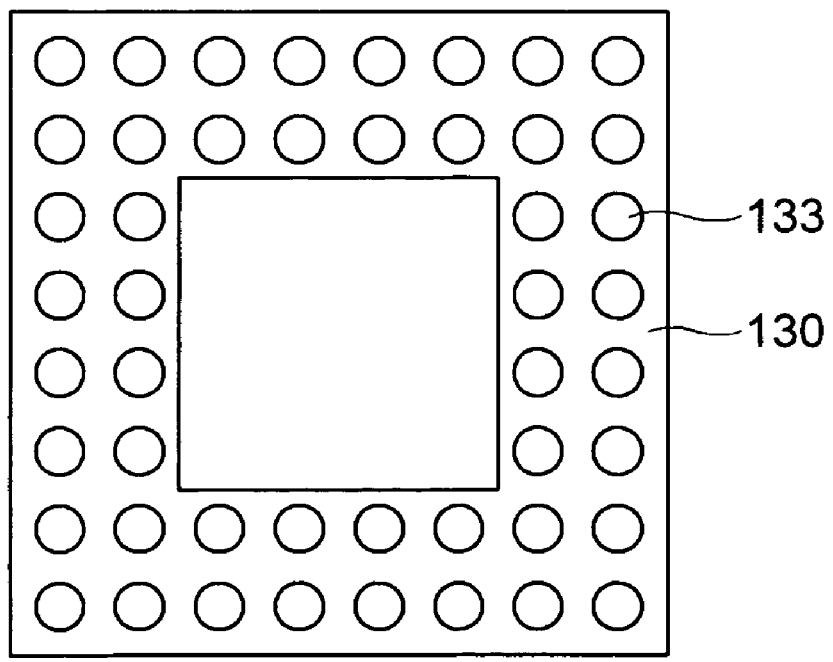

[FIG. 5]
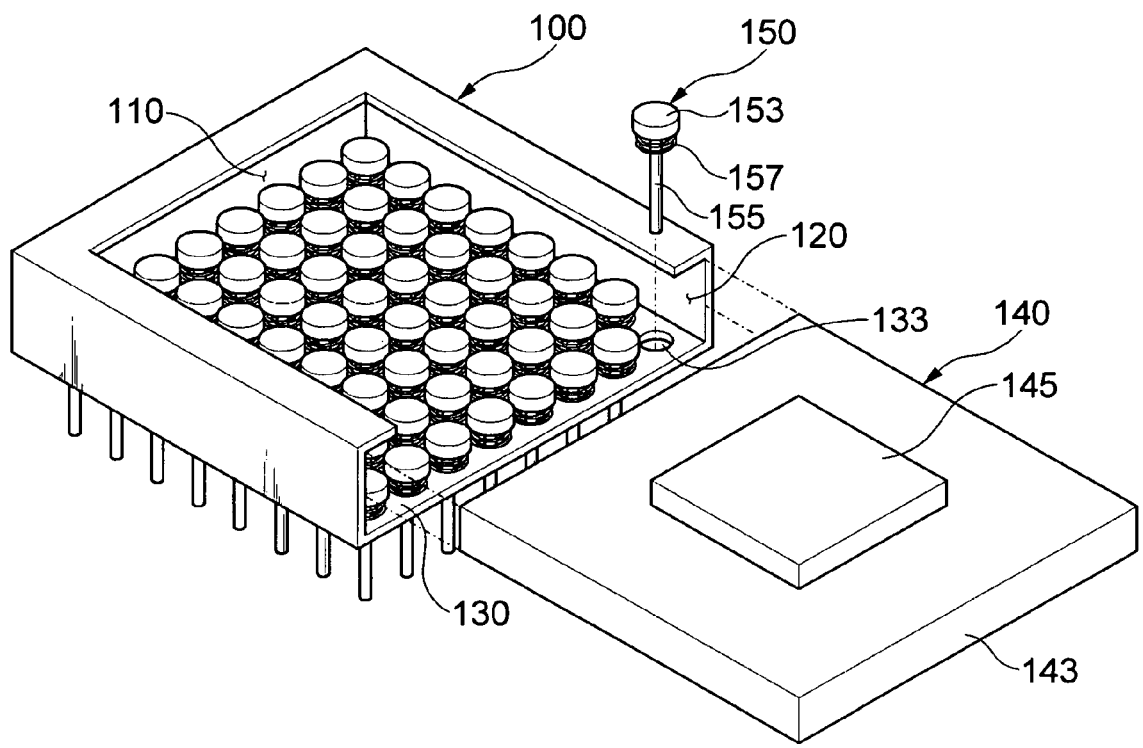

[FIG. 6]
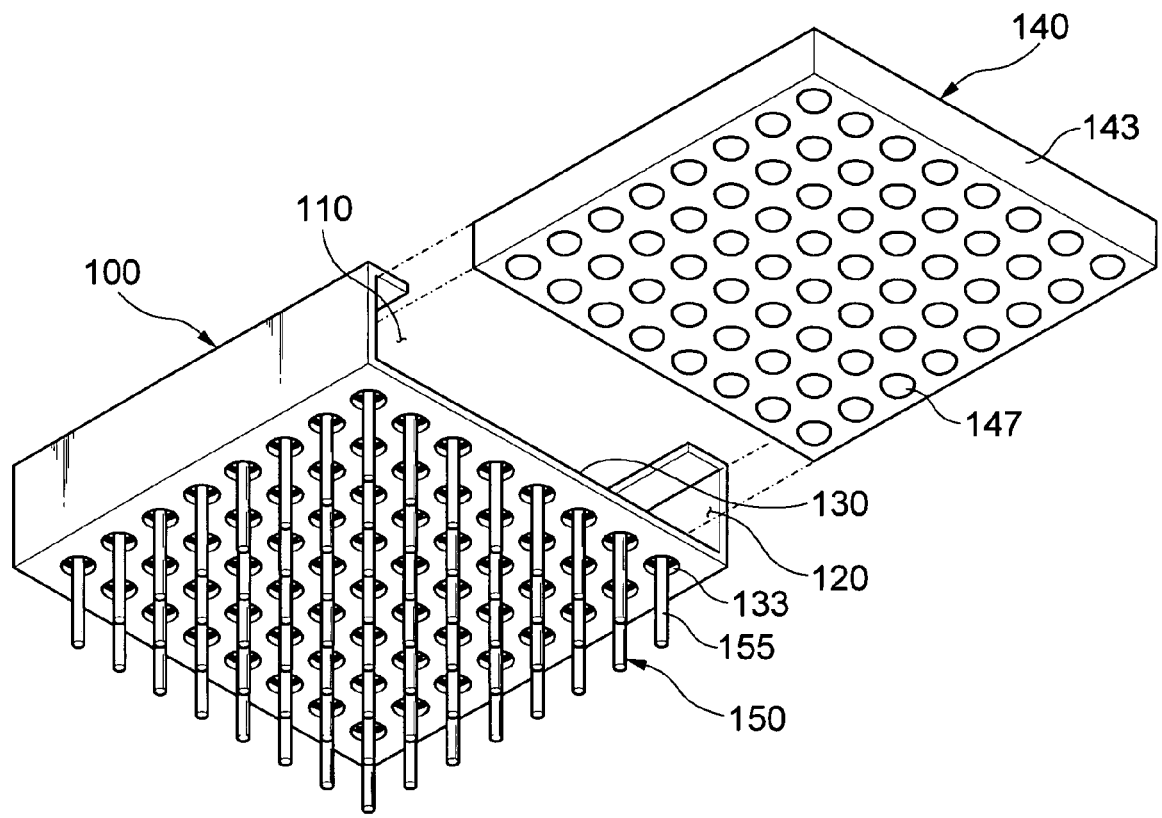

SEMICONDUCTOR PACKAGE TRANSFORMER

CROSS REFERENCES RELATED APPLICATIONS

The present application claims priority under 35 U.S.C. 119 and 35 U.S.C. 365 to Korean Patent Application No. 10-2008-0083719 (filed on Aug. 27, 2008), which is hereby incorporated by reference in its entirety.

BACKGROUND OF THE INVENTION

1. Field of the Invention

The present invention relates to a semiconductor package transformer, and more particularly, to a semiconductor package transformer that transforms a semiconductor package in a ball grid array (BGA) package form and a land grid array (LGA) package form into a semiconductor package in a pin grid array (PGA) package form.

2. Description of the Related Art

A semiconductor package serves to provide an electrical connection a chip designed with a circuit and to seal tightly and package it to endure external impacts, thereby allowing the chip to have physical function and shape so that it can be used in a real life. In other words, the semiconductor package is a result of a packaging process of finally manufacturing the chip.

While a high-performance chip has been continuously developed, limitations in physical characteristics of the semiconductor package rather than those in the chip itself have been recently increased. The reduction in size of the chip, the improvement in heat release ability and electrical performance ability, the improvement in reliability, and the dropoff in price depend on a semiconductor package technique.

The commonly generalized semiconductor package technique may be divided largely into a pin grid array scheme, a ball grid array scheme, a land grid array scheme, etc.

Reviewing these schemes, the pin grid array package is one sort of package that is used in an integrated circuit, and, in particular, is mainly used in a microprocessor. In the pin grid array package, metal pins are provided, in a rectangular array, on the entire surface of a bottom of a printed circuit board mounted with a chip or the portion thereof. At this time, the metal pins serve to transfer electrical signals to the printed circuit board mounted with the chip. However, the pin grid array package is disadvantageous in that a plurality of defects of the semiconductor package occur due to the position deviation of the pins, etc. during a pin junction process.

The ball grid array package is one sort of surface mount package that is used in an integrated circuit, and, in particular, is a standard of a DRAM package. In the ball grid array package, a hemisphere-type soldering terminal is provided on a rear surface of a printed circuit board mounted with a chip. Compared with the pin grid array package, the ball grid array package has a good thermal conductivity. However, the ball grid array package is disadvantageous in that since it is less flexible than the pin grid array package, if it is bent by the difference in thermal expansion coefficient, the impact and the vibration, it may break the soldering connected each other.

The land grid array package is one sort of surface mount package that is used in an integrated circuit, and, in particular, is used as a physical interface for a microprocessor. Differently from the pin grid array package, in the land grid array package, a copper pad plated with pure gold that can contact pins on a mainboard is provided instead of pins.

As portable electronic products have been recently compactized, a space on which a semiconductor package is mounted have been more decreased but multi-function and high performance have been more proceeded on products, such that there is a demand for improving a method of manufacturing a semiconductor package and an assembling ability thereof that can support the above.

SUMMARY OF THE INVENTION

The present invention proposes to solve the disadvantages and problems. It is an object of the present invention to provide a semiconductor package transformer that has an opening into which a semiconductor package is inserted on its front surface and has a case formed with holes corresponding to connection terminals on its bottom surface.

In order to accomplish the object, according to an embodiment of the present invention, there is provided a semiconductor package transformer including: a case where an opening into which a semiconductor package having a chip mounted on a substrate is inserted is formed on its front surface and an open part exposing the chip is formed on its upper surface; and a plurality of holes that are formed on the bottom surface of the case.

Further, a plurality of connection terminals may be formed on positions corresponding to the holes on the lower surface of the substrate.

Moreover, material of the case may be formed of low thermal expansion polymer.

In addition, the open part on the upper surface of the case may be formed in a size equivalent to or larger than the size of the chip mounted on the substrate.

Also, the holes may be formed on the entirety of the bottom surface of the case or portions other than a central portion of the case.

Further, the semiconductor package transformer may further include a lead pin that is inserted into the hole.

Moreover, the lead pin may include: a head; a connection pin that is projected from a central portion of the head; and a spring provided between the head and the connection pin.

In addition, the head of the lead pin may be formed in a disc shape or in a polygon shape.

BRIEF DESCRIPTION OF THE DRAWINGS

FIGS. 1 and 2 are perspective views of a semiconductor package transformer according to an embodiment of the present invention;

FIGS. 3 and 4 are plan views for a bottom surface of the semiconductor package transformer according to an embodiment of the present invention;

FIG. 5 is a perspective view for a process of inserting a semiconductor package into the semiconductor package transformer according to an embodiment of the present invention; and FIG. 6 is a bottom surface view for a process of inserting a semiconductor package into the semiconductor package transformer according to an embodiment of the present invention.

DETAILED DESCRIPTION OF THE PREFERRED EMBODIMENTS

The acting effects as well as the technical constitution of a semiconductor package transformer according to the present invention will be clearly understood by the detailed description below with reference to the accompanying drawings where the exemplary embodiments of the present invention are illustrated.

A semiconductor package transformer according to an embodiment of the present invention will be described in detail with reference to FIGS. 1 to 6.

FIGS. 1 and 2 are perspective views of a semiconductor package transformer according to an embodiment of the present invention, FIGS. 3 and 4 are plan views for a bottom surface of the semiconductor package transformer according to an embodiment of the present invention, FIG. 5 is a perspective view for a process of inserting a semiconductor package into the semiconductor package transformer according to an embodiment of the present invention, and FIG. 6 is a bottom surface view for a process of inserting a semiconductor package into the semiconductor package transformer according to an embodiment of the present invention.

As shown in FIGS. 1 and 2, the semiconductor package transformer according to the present invention is formed in a case 100 shape including an opening 120 into which a semiconductor package 140 is inserted being formed on its front surface, an open part 110 being formed on its upper surface, and a plurality of holes 133 being formed on its bottom surface 130.

Herein, as the semiconductor package 140, the semiconductor package form 140 in a ball grid array package form or a land grid array package form where a chip 145 is mounted on a substrate 143 and a plurality of connection terminals 147 for electrical connection with external equipments such as a mainboard are included in the lower surface of the substrate 143, may be used. At this time, the connection terminals 147 are formed of solder balls or solder bumps.

The case 100 is formed of low thermal expansion polymer. At this time, the low thermal expansion polymer is polymer having thermal expansion coefficient of 25 ppm° C. or less and including glass fiber and filler. High heat resistant resin having high heat resistance and strength, such as liquid crystal polymer (LCP), polyethereethereketon (PEEK), etc., generally corresponds to the low thermal expansion polymer.

Therefore, since the semiconductor package 140 having high thermal expansion coefficient due to heat generated from the chip 143 is surrounded by the case 100 formed of low thermal expansion polymer, the thermal expansion coefficient of the entire semiconductor package 140 is lowered, thereby improving stability and reliability of the semiconductor package 140.

The case 100 is preferably formed using any one of an injection molding method to push plastic melt to a transporter to fill and mold the melt in a mold through a nozzle mold and a compression molding method to fill and heat plastic material in a mold and then to pressurize it to mold the plastic material according to the shape of the mold, that are the most common molding methods of thermosetting resin and thermoplastic resin. Further, the upper surface on which the open part 110 of the case 100 is formed and the bottom surface 130 on which the plurality of holes 133 are formed may be manufactured integrally or may also be formed separately to be joined.

The semiconductor package 140 having the chip 145 mounted on the substrate 143 is inserted into the opening 120 of the case 100, wherein the chip 145 is exposed through the open part 110 of the case 100.

At this time, the open part 110 is preferably formed in a size equivalent to or larger than the chip 145 according to the size of the chip 145 mounted on the substrate 143. The open part 110 may be formed in various shapes other than the shape shown in FIGS. 1 and 2.

For the bottom surface 130 of the case 100, the plurality of holes 133 may be formed on the entirety of the bottom surface 130 of the case 100 or the portions other than the central portion thereof according to the positions corresponding to the connection terminals 147 formed on the lower surface of the substrate 143, that is, the constitutional shape of the connection terminals 147 formed on the lower surface of the substrate 143, as shown in FIGS. 3 and 4. At this time, the holes 133 may be processed by a laser method or a drill method.

Therefore, if the semiconductor package 140 is inserted through the opening 120 of the case 100, the connection terminals 147 formed on the lower surface of the substrate 143 are exposed through the holes 133 formed on the bottom surface 130 of the case 100 to contact an external equipment such as a mainboard, thereby being electrically connected.

Before the semiconductor package 140 is inserted into the case 100, adhesive having conductivity is coated or a tape is adhered to one side of the case 100 to allow the semiconductor package 40 not to be deviated from the inside of the case 100.

In order to transform the semiconductor package in the ball grid array package form and the land grid array package form where the connection terminals 147 are formed of solder balls and solder bumps into the semiconductor package 140 in a pin grid array package form as described above, a lead pin 150 that is inserted into the hole 133 formed on the bottom surface 130 of the case 100 is separately manufactured, as shown in FIGS. 5 and 6.

Next, if the semiconductor package 140 in the ball grid array package form and the land grid array package form is inserted into the case 100, it may be easily transformed into the semiconductor package 140 in the pin grid array package form where the pins are provided in the connection terminals 147.

At this time, the lead pin 150 includes a disc shaped or polygon shaped head 153, a connection pin 155 projected from a central portion of the head 153, and a spring 157 provided between the head 153 and the connection pin 155. The spring 157 is elasticized simultaneously with inserting the semiconductor package 140 into the case 100 to function as a fixing unit to more firmly adhere and fix the semiconductor package 140.

Therefore, the pin junction process is removed when manufacturing the pin grid array package form so that the defect of the semiconductor package 140 due to the position deviation of the pin that is generated during the pin junction process in the related art is also prevented, making it possible to remarkably improve quality and yield of the semiconductor package 140.

As described above, the semiconductor package transformer according to the present invention is provided with the semiconductor package transformer that includes the case 100 where the opening 120 into which the semiconductor package 140 is inserted is formed on its front surface and the plurality of holes 133 corresponding to the connection terminals 147 are formed on its bottom surface 130. The semiconductor package transformer inserts the separately manufactured lead pin 150 into the hole 133 and then inserts the semiconductor package 140 in the ball grid array package form and the land grid array package form into the opening 120. Therefore, the semiconductor package transformer has an advantage that it can be easily transformed into the semiconductor package 140 in the pin grid array package form.

In addition, the case 100 is formed of the low thermal expansion polymer to lower the thermal expansion coefficient of the entire semiconductor package 140, making it possible to improve stability and reliability of the semiconductor package 140.

As described above, the semiconductor package transformer according to the present invention is the semiconductor package transformer that includes the case where the opening into which the semiconductor package is inserted is formed on its front surface and the plurality of holes are formed on its bottom surface. The semiconductor package transformer inserts the separately manufactured lead pin into the hole and then inserts the semiconductor package in the ball grid array package form and the land grid array package form into the opening. Therefore, the semiconductor package transformer has an advantage that it can be easily transformed into the semiconductor package in the pin grid array package form.

In addition, the case is formed of the low thermal expansion polymer to lower the thermal expansion coefficient of the entire semiconductor package, making it possible to improve the stability and reliability of the semiconductor package.

Although the preferred embodiment of the present invention is described, it will be apparent to those skilled in the art that various modifications and variations can be made in the present invention without departing from the spirit or scope of the inventions.

Therefore, it is intended that the present invention covers the modifications and variations of this invention provided they come within the scope of the appended claims and their equivalents.

What is claimed is:

1. A semiconductor package transformer, comprising:
    a case having an opening part formed on its front surface and an open part formed on its upper surface;
    a semiconductor package having a chip mounted on a substrate inserted into the opening part, the open part exposing the chip; and
    a plurality of holes that are formed on the bottom surface of the case.

2. The semiconductor package transformer according to claim 1, wherein a plurality of connection terminals are formed on a lower surface of the substrate corresponding to the position of the holes.

3. The semiconductor package transformer according to claim 1, wherein a material of the case is formed of low thermal expansion polymer.

4. The semiconductor package transformer according to claim 1, wherein the open part on the upper surface of the case is formed in a size equivalent to or larger than the size of the chip mounted on the substrate.

5. The semiconductor package transformer according to claim 1, wherein the holes are formed on the entirety of the bottom surface of the case or portions other than a central portion of the case.

6. The semiconductor package transformer according to claim 1, further comprising:
    a lead pin that is inserted into the hole.

7. The semiconductor package transformer according to claim 6, wherein the lead pin includes:
    a head;
    a connection pin that is projected from a central portion of the head; and
    a spring provided between the head and the connection pin.

8. The semiconductor package transformer according to claim 7, wherein the head of the lead pin is formed in a disc shape or in a polygon shape.

\* \* \* \* \*